United States Patent [19]

D'Amico et al.

[11] 4,360,968

[45] Nov. 30, 1982

[54] METHOD FOR REDUCING SOLDER STICKING ON A PRINTED WIRING BOARD

[75] Inventors: John F. D'Amico, Montgomery Township, Somerset County; Michael A. DeAngelo, Jr., Ewing Township, Mercer County; Manjini Saminathan, Plainsboro Township, Middlesex County, all of N.J.

[73] Assignee: Western Electric Company, Incorporated, New York, N.Y.

[21] Appl. No.: 286,835

[22] Filed: Jul. 27, 1981

[51] Int. Cl.³ ............................................. H05K 3/34
[52] U.S. Cl. .................................. 29/840; 427/54.1; 427/96; 427/316; 228/203
[58] Field of Search ............ 427/54.1, 316, 299, 427/96, 97, 98, 322; 228/203; 29/839, 840

[56] References Cited

U.S. PATENT DOCUMENTS

| Re. 29,015 | 10/1976 | DeAngelo et al. | 427/54.1 |
|---|---|---|---|
| 3,892,885 | 7/1975 | Bragole | 427/54.1 |
| 3,894,163 | 7/1975 | Broyde | 427/43.1 |
| 4,018,940 | 4/1977 | Morgan | 427/54.1 |
| 4,025,407 | 5/1977 | Chang et al. | 427/54.1 X |
| 4,077,927 | 3/1978 | McPherson | 427/54.1 X |
| 4,091,127 | 5/1978 | McPherson | 427/304 |
| 4,097,350 | 6/1978 | Pastor et al. | 427/54.1 X |
| 4,100,037 | 7/1978 | Baron et al. | 427/304 X |
| 4,111,770 | 9/1978 | Najvar | 427/54.1 |
| 4,112,139 | 9/1978 | Shirk et al. | 427/54.1 |
| 4,121,015 | 10/1978 | McPherson | 428/418 |
| 4,150,171 | 4/1979 | Feldstein | 427/54.1 |
| 4,152,477 | 5/1979 | Haruta et al. | 427/98 X |
| 4,163,809 | 8/1979 | McGinniss et al. | 427/44 |
| 4,181,750 | 1/1980 | Beckenbaugh et al. | 430/414 |
| 4,216,246 | 8/1980 | Iwasaki et al. | 427/96 X |
| 4,287,226 | 9/1981 | Pirvics et al. | 427/54.1 |

*Primary Examiner*—John D. Smith
*Assistant Examiner*—Bernard F. Plantz
*Attorney, Agent, or Firm*—J. F. Spivak

[57] ABSTRACT

A method of inhibiting solder sticking between circuit elements of a partially uncured rubber-modified epoxy printed circuit board comprises exposing the board containing the circuit pattern thereon to UV radiation prior to the application of solder thereto.

13 Claims, No Drawings

METHOD FOR REDUCING SOLDER STICKING ON A PRINTED WIRING BOARD

TECHNICAL FIELD

This invention relates to the manufacture of printed circuits, more particularly, to a method for preventing solder sticking between circuit elements during device assembly.

BACKGROUND OF THE INVENTION

Substrates used in printed circuit boards generally comprise a polymeric coating over a base material. The substrates may be rigid or flexible. Typical base materials used in the industry are metallic or nonmetallic, such as steel or fiberglass mesh, respectively. In the case of flexible circuits, base materials are generally thin and the coating applied thereto is also thin so as to allow for flexibility of the substrate. Other substrates are also known in the art.

Typical coatings over the base materials for these printed circuits include phenolic resins, phenolic-rubber resin, ABS, various epoxy and rubber-modified epoxy resins. It has been found, especially with the use of rubber-modified epoxy resins, that in certain instances, especially with flexible circuit boards having rubber-modified epoxy coatings on the substrate, a problem exists which may be termed "solder sticking".

During the manufacture of a printed circuit assembly on a printed circuit substrate, solder is generally caused to be flowed over the substrate surface after the formation of the circuit pattern thereon. This solder is generally flowed over the surface during assembly of the printed circuit board with its associated electronic components by the wave soldering, solder dipping or drag soldering operations. All of the above soldering techniques are well known in the art. Ordinarily, the solder sticks only to the metallic circuit pattern previously applied to the substrate. However, occasionally, solder is found to stick to the substrate in areas between the circuit pattern or conductive pads. If the solder sticking is extensive or occurs between closely-spaced circuit lines or pads where a short circuit or leakage path may occur in the circuit, that particular circuit board may have to be rejected or reworked. This problem especially manifests itself in the newer circuit board technology wherein spacing between the lines or pads is often kept at a minimum.

There have been various efforts to control solder sticking involving many approaches including modifying the solder or soldering parameters, fluxes, and more recently a mechanical abrasion of the surface of the substrate. However, a more cost effective, and reliable method which does not alter or effect known solder or soldering parameters is desired.

We have made an unexpected discovery that exposure to short wavelength ultraviolet of printed circuits formed on partially uncured rubber-modified epoxy glass substrates as presently used in many flexible printed wiring boards, eliminates or substantially reduces solder sticking.

SUMMARY OF THE INVENTION

The novel process comprises exposing a printed circuit on a partially uncured rubber-modified epoxy coated substrate with short wave-length ultraviolet light so as to inhibit the tendency of solder sticking on those exposed areas of the substrate surface subsequent to the formation of the circuit thereon.

DETAILED DESCRIPTION OF THE INVENTION

In accordance with the present invention, a substrate for a printed circuit board comprises a flexible glass cloth or thin metal sheet or other base material having a rubber-modified epoxy resin coating thereon. The rubber-modified epoxy resin is particularly suitable where one wants to maintain a flexible substrate. Suitable formulations for such rubber-modified epoxy resin coatings for printed circuit boards can be found with reference to U.S. Pat. Nos. 4,077,927, 4,091,127 or 4,121,015 issued to C. A. McPherson and these patents are incorporated herein by reference. The useful rubber-modified epoxies generally are from about 92-98% cured as determined by the weight percent of extractables using hot toluene as the extractant.

The feature of the novel invention is the minimization of the tendency for solder sticking during the soldering operation employed in circuit board manufacture. We have unexpectedly discovered that solder sticking can be prevented or minimized by UV (ultraviolet) exposure of the resin as set forth herein subsequent to the formation of the printed circuit on the substrate, but prior to soldering. The particular experimental results as set forth herein are based upon exposure of the circuit bearing substrates immediately prior to the soldering step.

In general, any of the known procedures for the manufacture of the printed circuit boards including additive, partially additive or substractive processes are applicable provided the substrate comprises a partially uncured, rubber-modified epoxy resin. For example, using additive technology the method comprises the steps of swell etching a flexible, glass-rubber modified epoxy resin substrate, followed by catalyzing the surface of the substrate in accordance with a predetermined pattern, with any well known or available catalyst electrolessly plating copper or other metal e.g. Ni, on the catalyzed areas of the substrate so as to form a continuous metallic circuit pattern on the substrate and then exposing the substrate having that circuit pattern to ultraviolet light of a wave-length of 3200 A. or less, followed by fluxing and soldering the circuit pattern with or without simultaneously assembling the descrete devices thereon. The specific swell etchant or catalyst used is not critical nor is the particular electroless plating bath used critical. Any of the many available formulations are suitable. However, a one step, tin-palladium colloidal catalyst has been found to be preferred. In addition, the particular mode of applying the solder is likewise not critical. What is critical, is that a sufficient exposure to UV light of 3200 A. or less be made subsequent to metallization and prior to application of the solder.

Sensitization, catalyzation, and electroless deposition of metal circuit patterns are all well known in the art and solutions and processes therefor are readily commercially available. By way of example of such techniques one may make reference to the following U.S. Pat. Nos. 4,100,037; 4,181,750; 3,894,163; and U.S. Pat. No. Re. 29,015. It should be understood that where desired, the electroless circuit pattern may be built up by a full built electroless plate or by electroplating additional metal on the electrolessly deposited metal by well known electroplating techniques prior to the application of the solder. Likewise one may apply a tin electroplate over the metallic pattern. The method of applying the solder to the circuit pattern used in the experiments exemplified in the following tables is the well known wave-soldering method. In this method the printed circuit board having a circuit pattern thereon including components and flux is passed over a fountain of molten solder, and upon removal, the solder should stick only to the plated surface and not to the unplated portions of the circuit board. Without the application of ultraviolet light to the circuit board prior to soldering in accordance with this invention, it is often found that a large amount of spurious solder sticking occurs on non-plated portions of the circuit board.

It is believed that the short wavelength UV light acts to further cure the partially uncured epoxy thereby changing its surface and making it less receptive to wetting by the solder. We have discovered that it is critical that the activating UV employed have an output of about 3200 A. or less, for example, from about 2300 A. to about 3200 A. It has also been found to be preferred to use some heat together with the UV light. For example, temperatures of from 150° C. to 165° C. appear to be preferred.

EXAMPLE I

A glass-rubber modified epoxy resin flexible substrate is swelled with methyl ethyl ketone, dimethyl formamide or propylene carbonate and etched with chromic acid and a circuit pattern is applied thereon by means of a photoresist as is well known in the art. The substrate is then treated with commercially available MacDermid 9070 colloidal catalyst so as to form a catalytic layer on the substrate and the photoresist is removed so as to leave the catalyst on the surface in conformity to the desired circuit pattern. The substrate is then subjected to an electroless copper plating bath such as MacDermid 9085 electroless copper bath. After removal from the bath, rinsing and drying, the substrate containing the circuit pattern thereon is exposed to broad band ultraviolet radiation of less than 3200 A. using a medium pressure mercury ultraviolet source such as in a Colight ultraviolet curing system for a period of about 30 seconds. The surface is then fluxed with commercially available solder fluxes such as Alpha 611F available from Alpha Metals Corporation or Nassau Recycling Corporation R211 flux. Thereafter, solder is applied to the substrate by previously described wave soldering techniques. Substrates so treated, are found to be essentially free of significant solder sticking. Experimental evidence has shown that exposures utilizing the medium pressure mercury lamps of the Colight curing system for from 7½ to 45 seconds is sufficient to produce substantially reduced solder sticking. This exposure is equivalent to about 0.6 to 0.85 joule/second/cm² on the surface of the substrate. Little difference was noted between the use of high intensity versus low intensity exposures or between baked and nonbaked samples, i.e., samples which were baked prior to exposure. However, samples given multiple, lower level exposures (but the same total dosage) seem to leave somewhat more spurious solder as compared to those given the same dosage in a single higher intensity exposure. Further, exposures longer than 20 seconds consistently gave results significantly better than those shorter than 20 seconds. No significant differences were detected by varying the fluxes where sufficiently long exposure times were employed.

EXAMPLE II

Ultraviolet exposure of a partially uncured rubber-modified epoxy substrate having a metal circuit pattern thereon was performed as in Example I with the same results. Here, however, the circuit was formed by the following semi-additive method. The substrate is swell etched and catalyzed. A thin (~0.2 mil) blanket electroless copper layer is applied. A negative photoresist pattern is then formed and the exposed copper is electroplated with copper to a thickness of about 1.5-2 mils. A ½ mil tin solder plate is electroplated over the exposed metal circuit pattern. The resist is then removed with solvent and the board is etched to remove the thin blanket coat under the resist. Optionally a cover coat may be applied to the surface, e.g., using Grace Co. GFR covercoat which should then be followed by a bake for several hours at about 125° C. The board having the copper circuit thereon is exposed to UV light of less than 3200 A. as taught herein, the discrete device components are put in place, flux is applied and the board is soldered.

Table I is a representation of the number and type of solder particles sticking to the substrate as a function of exposure. Exposure given in joules/cm² is the energy of ultraviolet light impinging on a square centimeter of circuit board. The nature and number of solder particles sticking was determined by microscopically examining the entire surface of a soldered circuit. Column I represents the number of wispy type solder defects which adhere strongly to the surface of the substrate. Column II represents the number of solder balls of <10 mil diameter (and greater than 5 mils) loosely bound to the substrate surface. A wisp is generally an odd shaped solder formation having high adhesion to the substrate wherein its removal often causes chipping or removal of the substrate thereunder. A circuit board having a small number (≦6) of tiny (<5 mil) solder balls but with no wisps is acceptable.

TABLE I

Effect on Exposure on Solder Defect Incidence
[Flux - 611F (Sp. gr = 0.85)
Soldering Temp. - 480° F., Conveyor Speed - 11fpm,
Circuit area - 36cm² (9cm² of exposed dielectric).]

| Exposure (joules/cm²) | Defects/Circuit | |
|---|---|---|
| | I | II |
| 0.0 | 24.0 | 4.0 |
| 8.2 | 1.5 | 9.0 |
| 9.4 | 0.5 | 10.5 |
| 11.2 | 1.0 | 7.0 |
| 13.7 | 1.5 | 3.5 |
| 17.8 | 0.0 | 1.5 |
| 20.9 | 0.0 | 1.0 |
| 26.7 | 0.0 | 1.5 |

Defect Description
I Wispy solder defects that adhere strongly to the surface.
II Balls 5 to −10 mils in diameter bound loosely to the surface.

As can be seen from the Table, unexposed samples were very poor and unacceptable due to the large number of wisps. Upon the application of UV light, the number of wisps decreased drastically, however, at first the number of balls increased upon further exposure the number of balls were reduced and finally all wisps disappeared. Generally, samples with an exposure of less than about 15 W-sec/cm² were unacceptable while samples with exposures of greater than 15 W-sec/cm² were acceptable. Exposures of at least 17 W-sec/cm² are preferred.

Upon further evaluation of the effect of the UV exposure upon raw circuit board material comprising glass-rubber modified epoxy resin, it was found that when wave-soldering at a temperature of 480° F. utilizing Alphametals 611F flux, an unexposed bare substrate had extensive fine wisps distributed throughout its surface while board material which was exposed for from 7½ seconds up to 45 seconds at both low and high intensity settings of the UV lamp (equivalent to exposure of 0.6 to 0.8 Watts/cm²) showed no solder sticking both with and without flux.

The following is a table (Table II) showing the average results of soldering evaluation of ultraviolet exposed semi-additive manufactured circuits. All but those circuits indicated as control circuits were first exposed to ultraviolet radiation prior to wave-soldering at 480°F. employing an Alphametals 611F flux. Each circuit board tested comprised an additive glass-rubber modified epoxy substrate having from 45 to 50 circuit pads. A circuit pad is an area of conductive material enclosing a through-hole into which the device leads are inserted and soldered. The dielectric spacing between adjacent closely spaced pads is a particularly critical region in which the presence of solder particles is especially unwanted, as it may produce a circuit reliability hazard. Results were obtained for circuit boards which were baked at 130° C. for four hours prior to soldering and those which were not baked. Ultraviolet exposure was accomplished using the Colight ultraviolet curing machine which contains three ultraviolet lamps set to produce about 0.84 Watts/cm² or (200 Watts/inch) at its high setting and 0.6 Watts/cm² or (140 Watts/inch) at the low intensity setting. Each lamp is 24 inches in length.

ther cure said uncured rubber-modified epoxy base thereby making it less receptive to wetting by the solder.

2. The method recited in claim 1 including the step of flowing solder over the circuit board subsequent to ultraviolet exposure.

3. The method recited in claim 2 wherein the circuit board is flexible.

4. The method recited in claim 1 wherein the ultraviolet radiation includes radiation in the wavelength range of from 2300 A. to 3200 A.

5. The method recited in claim 1 including simultaneously heating the circuit board during ultraviolet exposure.

6. The method recited in claim 5 wherein the circuit board is heated to between 150° C. to 165° C.

7. The method recited in claims 1 or 5 wherein the energy density of exposure is at least 15 joules/cm².

8. A method of manufacturing a printed circuit board comprising the steps of:
  (a) forming a metallized circuit pattern on a 92–98% cured rubber-modified epoxy surface;
  (b) exposing said surface to ultraviolet radiation; to further cure said uncured rubber-modified epoxy base thereby making it less receptive to wetting by the solder and
  (c) applying solder over the surface and circuit pattern such that said solder essentially coats and adheres only to the metallized pattern.

9. The method recited in claim 8 including mounting discrete device components onto the circuit.

10. The method recited in claim 9 wherein said device components are mounted during the soldering operation.

11. The method recited in claims 8 or 9 wherein said circuit board is flexible.

TABLE II

| SOLDERING EVALUATION OF UV EXPOSED CIRCUITS NORMALIZED IN TERMS OF VARIOUS DEFECTS | | | | | |
|---|---|---|---|---|---|
| | # OF BALLS BETWEEN PADS | BALLS OFF/PADS | # OF BRIDGES | # OF PART BRIDGES | # OF WISPS |
| CONTROL/NO BAKE | 27 | 2.0 | 1.0 | 1.0 | 3.5 |
| CONTROL/BAKE | 10 | 1.5 | 1.0 | 1.0 | 2.5 |
| 15 SECONDS LOW/BAKE 3.67 ft/min. | 0.0 | 1.5 | 0.0 | 0.0 | 0.0 |
| 15 SECONDS LOW/NO BAKE | 1.5 | 0.0 | 0.0 | 0.0 | 0.5 |
| 30 SECONDS LOW/NO BAKE | 0.0 | 2.5 | 1.0 | 0.0 | 0.0 |
| 30 SECONDS LOW/BAKE | 0.0 | 2.5 | 0.0 | 0.0 | 0.0 |

What is claimed is:

1. A method for inhibiting solder sticking on a printed circuit board comprising a metallic circuit pattern on a partially uncured rubber-modified epoxy base wherein the epoxy is from 92–98% cured comprising the step of exposing said circuit board containing said circuit pattern to ultraviolet radiation of less than 3200 A. to fur- 12. The method recited in claims 8 or 9 wherein said radiation includes wavelengths of from 2300 A. to 3200 A.

13. The method recited in claim 12 including heating the circuit board during exposure to the ultraviolet radiation.

* * * * *